(12) United States Patent
Sun et al.

(10) Patent No.: US 12,471,475 B2
(45) Date of Patent: Nov. 11, 2025

(54) DISPLAY PANEL WITH COMPENSATION PIXELS, AND ELECTRONIC DEVICE

(71) Applicant: GUANGDONG OPPO MOBILE TELECOMMUNICATIONS CORP., LTD., Guangdong (CN)

(72) Inventors: Zhou Sun, Guangdong (CN); Xiaoxiang He, Guangdong (CN); Haiyu Zhang, Guangdong (CN); Haijie Zhuo, Guangdong (CN); Jiewen Huang, Guangdong (CN); Qianbo Jiang, Guangdong (CN); Jiazi Huang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 434 days.

(21) Appl. No.: 18/090,727

(22) Filed: Dec. 29, 2022

(65) Prior Publication Data

US 2023/0225170 A1     Jul. 13, 2023

Related U.S. Application Data

(63) Continuation of application No. PCT/CN2021/114314, filed on Aug. 24, 2021.

(30) Foreign Application Priority Data

Sep. 1, 2020   (CN) ......................... 202010905906.3

(51) Int. Cl.
*H10K 59/35*    (2023.01)
*H10K 59/38*    (2023.01)
*H10K 59/80*    (2023.01)

(52) U.S. Cl.
CPC ......... *H10K 59/353* (2023.02); *H10K 59/352* (2023.02); *H10K 59/38* (2023.02); *H10K 59/8792* (2023.02)

(58) Field of Classification Search
CPC ............... H10K 59/353; H10K 59/352; G09G 2340/0407
See application file for complete search history.

(56) References Cited

U.S. PATENT DOCUMENTS 9,761,171 B2    9/2017  Huang et al.
2008/0001525 A1 1/2008  Chao et al.
(Continued)

FOREIGN PATENT DOCUMENTS

CN    109599053 A    4/2019
CN    109962092 A    7/2019
(Continued)

OTHER PUBLICATIONS

International Search Report and Written Opinion with English Translation for PCT Application PCT/CN2021/114314 mailed Nov. 3, 2021. (18 pages).

(Continued)

*Primary Examiner* — Nduka E Ojeh
(74) *Attorney, Agent, or Firm* — Young Basile Hanlon & MacFarlane, P.C.

(57) ABSTRACT

A display panel, a display apparatus, and a display device. The display panel includes a display panel, including: a first display region, including first pixel units; and a second display region, including second pixel units and compensation pixel units. A pixel density of the first display region is greater than a pixel density of the second display region; the compensation pixel units are arranged in a region between the second display region and the first display region; the compensation pixel units are configured to compensate for a (Continued)

color difference between the first display region and the second display region. The compensation pixel units include first compensation pixel units and second compensation pixel units; the first compensation pixel units are disposed on a side of the second display region, and the second compensation pixel units are disposed on another side of the second display region along a row direction.

18 Claims, 6 Drawing Sheets

(56) References Cited

U.S. PATENT DOCUMENTS

| | | | |
|---|---|---|---|
| 2018/0122283 | A1 | 5/2018 | Kim et al. |
| 2019/0140030 | A1 | 5/2019 | Huangfu et al. |
| 2019/0326364 | A1 | 10/2019 | Chai et al. |
| 2020/0066809 | A1 | 2/2020 | Liu |
| 2020/0075689 | A1 | 3/2020 | Matsueda |
| 2021/0358379 | A1* | 11/2021 | Li .................. G09G 3/20 |
| 2021/0367020 | A1* | 11/2021 | Bok ................ H01L 25/105 |
| 2023/0082133 | A1* | 3/2023 | Sun ................ G09G 3/30 257/89 |

FOREIGN PATENT DOCUMENTS

| | | |
|---|---|---|
| CN | 110349528 A | 10/2019 |
| CN | 110379836 A | 10/2019 |
| CN | 110504289 A | 11/2019 |
| CN | 110570774 A | 12/2019 |
| CN | 110619813 A | 12/2019 |
| CN | 110620129 A | 12/2019 |
| CN | 110648620 A | 1/2020 |
| CN | 110675835 A | 1/2020 |
| CN | 110767159 A | 2/2020 |
| CN | 110767707 A | 2/2020 |
| CN | 110914891 A | 3/2020 |
| CN | 111028692 A | 4/2020 |
| CN | 210574780 U | 5/2020 |
| CN | 111292673 A | 6/2020 |
| CN | 111477097 A | 7/2020 |
| CN | 111477103 A | 7/2020 |
| CN | 112037704 A | 12/2020 |
| EP | 3813044 A1 | 4/2021 |
| WO | 2015109799 A1 | 7/2015 |
| WO | 2020150963 A1 | 7/2020 |

OTHER PUBLICATIONS

Chinese First Office Action with English Translation for CN Application 202010905906.3, mailed Jun. 21, 2022. (21 pages).

Chinese Notification to grant Patent Right for Invention with English Translation for CN Application 202010905906.3 mailed Dec. 12, 2022. (11 pages).

European Search Report for European Patent Application No. 21863540.7 mailed Nov. 24, 2023 (9 pages).

* cited by examiner

DISPLAY PANEL WITH COMPENSATION PIXELS, AND ELECTRONIC DEVICE

CROSS-REFERENCE TO RELATED APPLICATION(S)

The present disclosure is a continuation-application of International (PCT) Patent Application No. PCT/CN2021/114314, filed on Aug. 24, 2021, which claims priority of Chinese Patent Application No. 202010905906.3, filed on Sep. 1, 2020, the entire contents of both of which are hereby incorporated by reference.

TECHNICAL FIELD

The present disclosure relates to the field of electronic device technologies, and in particular to a display panel, a display apparatus, and an electronic device.

BACKGROUND

With the development and progress of technology, full-screen is increasingly and widely used in various terminal devices, but for terminal devices with front cameras, the need to consider the installation of front cameras makes it difficult to achieve full-screen in the real sense of the current mobile phones or other mobile terminal devices. Therefore, how to truly realize the coexistence of full-screen and front camera is a problem that is required to be solved.

It should be noted that the information disclosed in the Background section is only for the purpose of enhancing the understanding of the background of the present disclosure, and thus may include information that does not constitute prior art known to those skilled in the art.

SUMMARY

The purpose of the present disclosure is to provide a display panel, a display apparatus, and an electronic device, thereby solving, at least in part, one or more problems caused by defects in the related art.

According to a first aspect, the present disclosure provides a display panel. The display panel includes a first display region and a second display region. The first display region includes a plurality of first pixel units, and the second display region includes a plurality of second pixel units and a plurality of compensation pixel units. A pixel density of the first display region is greater than a pixel density of the second display region; the first display region and the second display region are connected, and the plurality of compensation pixel units are arranged in a region between the second display region and the first display region; the plurality of compensation pixel units are configured to compensate for a color difference between the first display region and the second display region. The plurality of compensation pixel units include a plurality of first compensation pixel units and a plurality of second compensation pixel units; the plurality of first compensation pixel units are disposed on a side of the second display region, and the plurality of second compensation pixel units are disposed on another side of the second display region opposite to the side along a row direction.

According to a second aspect, the present disclosure provides an electronic device. The electronic device includes the display panel as above, a transparent cover arranged on a light-emitting side of the display panel, and a camera module arranged on a back side of the display panel. The camera module is arranged facing the second display region.

According to a third aspect, the present disclosure provides a display panel. The display panel includes a first display region and a second display region. The first display region includes a plurality of first pixel units, and the second display region includes a plurality of second pixel units, a plurality of first compensation pixel units, and a plurality of second compensation pixel units. A pixel density of the first display region is greater than a pixel density of the second display region. The second display region is a rectangular structure; the first display region includes a first sub-display region and a second sub-display region, the first sub-display region being disposed on a first side of the second display region, the second sub-display region being disposed on a second side of the second display region, and the first side and the second side being opposite to each other along a row direction. The plurality of first compensation pixel units are distributed along a column direction between the first sub-display region and the second display region, and the plurality of second compensation pixel units are distributed along the column direction between the second sub-display region and the second display region, the column direction being perpendicular to the row direction.

It can be understood that the above general description and the later detailed descriptions are exemplary and explanatory only and do not limit the present disclosure.

BRIEF DESCRIPTION OF DRAWINGS

The accompanying drawings herein are incorporated into and form part of the specification, illustrate embodiments consistent with the present disclosure, and are used in conjunction with the specification to explain the principles of the present disclosure. It will be apparent that the accompanying drawings in the following description are only some embodiments of the present disclosure, and that other drawings may be obtained from them without creative effort by those skilled in the art.

DETAILED DESCRIPTION

Figure 1:
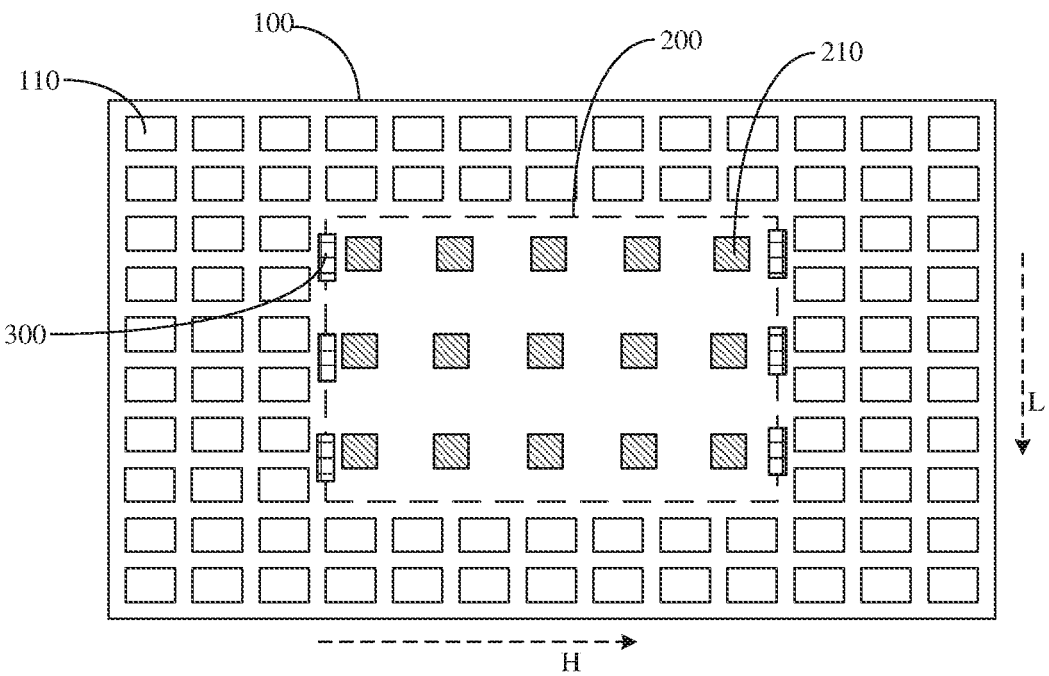
FIG. 1 is a schematic view of pixel distribution of a display panel according to an embodiment of the present disclosure.

Embodiments will now be described more fully with reference to the accompanying drawings. However, the embodiments may be implemented in a variety of forms and should not be construed as being limited to the embodiments set forth herein; rather, the provision of these embodiments allows the present disclosure to be comprehensive and complete and communicates the ideas of the embodiments in a comprehensive manner to those skilled in the art. Identical reference signs in the drawings indicate identical or similar structures, and thus their detailed description will be omitted.

Although relative terms such as "up" and "down" are used in this specification to describe a relative relationship of one component to another, these terms are used in this specification only for convenience, for example, according to the orientation of the embodiments described in the accompanying drawings. It is understood that when a device is flipped such that it is upside down, the component described as being "up" will become the component described as being "down". When a structure is "on" other structures, it may mean that the structure is integrally formed on other structures, or that the structure is "directly" arranged on other structures, or that the structure is "indirectly" arranged on other structures through another structure.

According to a first aspect, the present disclosure provides a display panel. The display panel includes a first display region and a second display region. The first display region includes a plurality of first pixel units, and the second display region includes a plurality of second pixel units and a plurality of compensation pixel units. A pixel density of the first display region is greater than a pixel density of the second display region; the first display region and the second display region are connected, and the plurality of compensation pixel units are arranged in a region between the second display region and the first display region; the plurality of compensation pixel units are configured to compensate for a color difference between the first display region and the second display region. The plurality of compensation pixel units include a plurality of first compensation pixel units and a plurality of second compensation pixel units; the plurality of first compensation pixel units are disposed on a side of the second display region, and the plurality of second compensation pixel units are disposed on another side of the second display region opposite to the side along a row direction.

In some embodiments, a number of sub-pixels in each second pixel units is less a number of sub-pixels in each first pixel unit.

In some embodiments, the sub-pixels of the first pixel unit include a first sub-pixel, two second sub-pixels, and a third sub-pixel; and the sub-pixels of the second pixel unit include a first sub-pixel, a second sub-pixel, and a third sub-pixel; wherein an area of the third sub-pixel is greater than an area of the first sub-pixel and greater than an area of the second sub-pixel.

In some embodiments, the plurality of first pixel units of the first display region are distributed in a plurality of rows; in each first pixel unit in an odd row, the first sub-pixel is disposed on a first side of the third sub-pixel; in each first pixel unit in an even row the first sub-pixel is disposed on a second side of the third sub-pixel, the first side being opposite to the second side.

In some embodiments, the first display region includes a first sub-display region and a second sub-display region; the first sub-display region is disposed on the side of the second display region, and the second sub-display region is disposed on the other side of the second display region opposite to the side along the row direction; the plurality of first compensation pixel units are distributed along a column direction between the first sub-display region and the second display region, and the plurality of second compensation pixel units are distributed along the column direction between the second sub-display region and the second display region.

In some embodiments, the plurality of second pixel units of the second display region are distributed in a plurality of rows; in each second pixel unit in an odd row, the third sub-pixel is disposed on a side of the first sub-pixel away from the first sub-display region; in each second pixel unit in an even row, the third sub-pixel is disposed on a side of the first sub-pixel close to the first sub-display region.

In some embodiments, in each second pixel unit in a column close to the first sub-display region, the first sub-pixel is closer to the first sub-display region than the third sub-pixel; in each second pixel unit in a column close to the second sub-display region, the first sub-pixel is closer to the second sub-display region than the third sub-pixel.

In some embodiments, each first compensation pixel unit includes only one third sub-pixel, and the first compensation pixel unit is arranged in a region between the second display region and the first sub-display region.

In some embodiments, each second compensation pixel unit includes only two second sub-pixels and one third sub-pixel, and the two second sub-pixels are disposed on a side of the third sub-pixel away from the first sub-display region; the second compensation pixel unit is disposed in a region between the second display region and the second sub-display region.

In some embodiments, the first sub-pixel is a red sub-pixel, the second sub-pixel is a green sub-pixel, and the third sub-pixel is a blue sub-pixel.

In some embodiments, the first sub-pixel is a red sub-pixel, the second sub-pixel is a yellow sub-pixel, and the third sub-pixel is a blue sub-pixel.

In some embodiments, the display panel further includes: a light-emitting layer, including a first light-emitting region and a second light-emitting region, the first light-emitting region being overlapped with the first pixel region, and the second light-emitting region being overlapped with the second pixel region; wherein the first light-emitting region includes a plurality of first light-emitting units, and the second light-emitting region includes a plurality of second light-emitting units; the plurality of first light-emitting units are arranged facing the plurality of first pixel units, and the plurality of second light-emitting units are arranged facing the plurality of second pixel units.

In some embodiments, the display panel further includes: a pixel electrode layer, including a first electrode region and a second electrode region, the first electrode region being overlapped with the first pixel region, and the second electrode region being overlapped with the second pixel region; wherein the first electrode region includes a plurality of first electrode units, and the second electrode region includes a plurality of second electrode units; the plurality of first electrode units are arranged facing the plurality of first pixel units, and the plurality of second electrode units are arranged facing the plurality of second pixel units.

In some embodiments, the display panel further includes: a driver circuit layer, wherein a pixel driving circuit is arranged in the driver circuit layer, and the pixel driving circuit includes a plurality of driving units; each sub-pixel is connected to a corresponding driving unit.

In some embodiments, the display panel further includes: a color film layer, including a first pattern region and a second pattern region; wherein a plurality of first pattern blocks in a plurality of colors are arranged in the first pattern region, and the plurality of first pattern blocks are arranged facing the plurality of first pixel units; a plurality of second pattern blocks in a plurality of colors are arranged in the second pattern region, and the plurality of second pattern block are arranged facing the plurality of second pixel units.

In some embodiments, the display panel further includes: a black matrix layer, defining a plurality of openings configured to expose the plurality of first pattern blocks and the plurality of second pattern blocks.

In some embodiments, the black matrix layer is arranged with a light transmission region facing the second display region, configured to transmit external light to an under-screen camera.

According to a second aspect, the present disclosure provides an electronic device. The electronic device includes the display panel as above, a transparent cover arranged on a light-emitting side of the display panel, and a camera module arranged on a back side of the display panel. The camera module is arranged facing the second display region.

According to a third aspect, the present disclosure provides a display panel. The display panel includes a first display region and a second display region. The first display region includes a plurality of first pixel units, and the second display region includes a plurality of second pixel units, a plurality of first compensation pixel units, and a plurality of second compensation pixel units. A pixel density of the first display region is greater than a pixel density of the second display region. The second display region is a rectangular structure; the first display region includes a first sub-display region and a second sub-display region, the first sub-display region being disposed on a first side of the second display region, the second sub-display region being disposed on a second side of the second display region, and the first side and the second side being opposite to each other along a row direction. The plurality of first compensation pixel units are distributed along a column direction between the first sub-display region and the second display region, and the plurality of second compensation pixel units are distributed along the column direction between the second sub-display region and the second display region, the column direction being perpendicular to the row direction.

In some embodiments, a number of sub-pixels in each second pixel units is less than a number of sub-pixels in each first pixel unit; the sub-pixels of the first pixel unit include a first sub-pixel, two second sub-pixels, and a third sub-pixel, and the sub-pixels of the second pixel unit include a first sub-pixel, a second sub-pixel, and a third sub-pixel.

Embodiments of the present disclosure provide a display panel. FIG. 1 illustrates a. display panel, the display panel includes a first display region 100 and a second display region 200; the first display region 100 includes multiple first pixel units 110, and the second display region 200 includes multiple second pixel units 210 and multiple compensation pixel units 300; a pixel density of the first display region 100 is greater than a pixel density of the second display region 200; the first display region 100 and the second display region 200 are connected, and the multiple compensation pixel units 300 are arranged in a region between the second display region 200 and the first display region 100 (a junction of the second display region 200 and the first display region 100); the multiple compensation pixel units 300 are configured to compensate for a color difference between the first display region 100 and the second display region 200.

Embodiments of the present disclosure provide a display panel including a first display region 100 and a second display region 200; the first display region 100 includes multiple first pixel units 110, each first pixel unit 110 including multiple sub-pixels; the second display region 200 includes multiple second pixel units 210; the pixel density of the first display region is greater than the pixel density of the second display region, which can form a blank region in the second display region 200, and the blank region may be configured to arrange light-transmitting units to realize the light intake of an under-screen camera module, taking into account both the light intake of the under-screen camera module and the display of the second display region 200, which is conducive to realizing the full-screen display of the display panel in a real sense. In addition, by arranging the compensation pixel units 300 at the junction of the first display region 100 and the second display region 200, the problem of color difference between the first display region 100 and the second display region 200 may be solved.

The display panel provided by the embodiments of the present disclosure will be described in detail as follows.

The display panel includes a first display region 100 and a second display region 200; the first display region 100 includes multiple first pixel units 110, each first pixel unit 110 including multiple sub-pixels; the second display region 200 includes multiple second pixel units 210, each second pixel unit 210 including multiple sub-pixels; the number of the sub-pixels in each second pixel units 210 is less than the number of the sub-pixels in each first pixel unit 110, and a pixel density of the first display region is greater than a pixel density of the second display region.

The first display region 100 in the display panel in the embodiments may be a normal display region, and the second display region 200 may be a region facing the under-screen camera. The multiple first pixel units 110 are arrayed in the first display region 100, and the multiple second pixel units 210 are arrayed in the second display region 200.

The first pixel unit 110 may include multiple sub-pixels, and the second pixel unit 210 may include multiple sub-pixels, and the number of sub-pixels in the first pixel unit 110 is greater than the number of sub-pixels in the second pixel unit 210.

Figure 2:
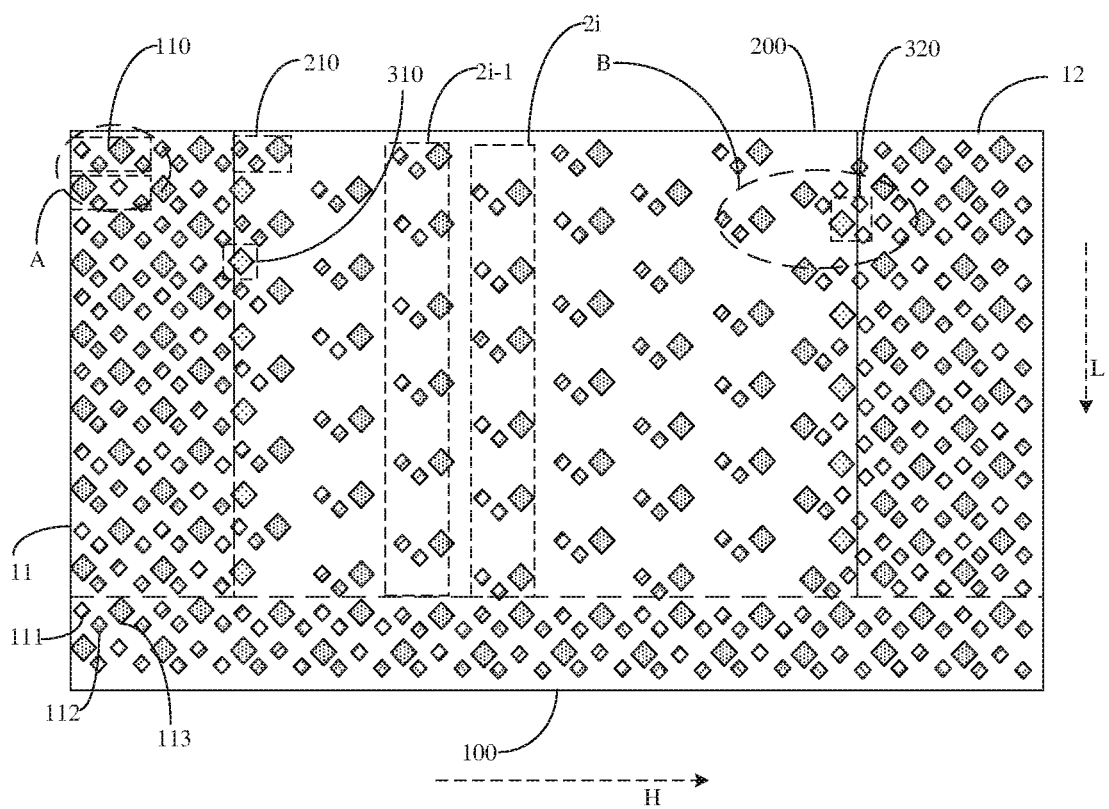
FIG. 2 is a schematic view of pixel distribution of a display panel according to another embodiment of the present disclosure.

Exemplarily, as illustrated in FIG. 2, the first pixel unit 110 may include a first sub-pixel 111, two second sub-pixels 112, and a third sub-pixel 113; and the second pixel unit 210 may include a first sub-pixel 111, a second sub-pixel 112, and a third sub-pixel 113.

Figure 3:
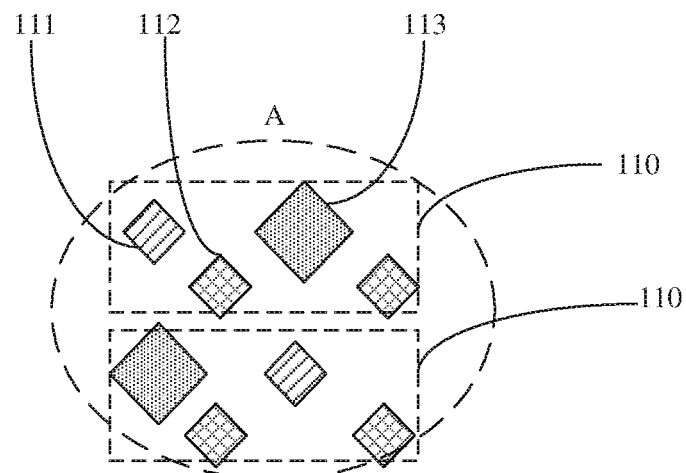
FIG. 3 is a partial enlarged view of area A circumscribed in FIG. 2.

The first sub-pixel 111 may be a red sub-pixel (R), the second sub-pixel 112 may be a green sub-pixel (G), and the third sub-pixel 113 may be a blue sub-pixel (B). As illustrated in FIG. 3, the sub-pixels in the first pixel unit 110 may be arranged in the manner of RGBG and BGRG, and the sub-pixels in the second pixel unit 210 may be arranged in the manner of RGB and BGR. Of course, the color of the sub-pixels may be other colors in practical applications, and the embodiments of the present disclosure are not limited in this regard. For example, the second sub-pixel 112 may be a yellow sub-pixel (Y), in which case the sub-pixels in the first pixel unit 110 may be arranged in the manner of RYBY and BYRY, and the sub-pixels in the second pixel unit 210 may be arranged in the manner of RYB and BYR, etc.

The multiple first pixel units 110 are arrayed in the first display region 100, that is, the first display region 100 includes multiple rows of first pixel units 110. The first sub-pixel 111 in a first pixel unit 110 in an odd (2n−1, n being a positive integer) row of first pixel units 110 is disposed on a first side of a corresponding third sub-pixel 113, and the first sub-pixel 111 in a first pixel unit 110 in an even (2n, n being a positive integer) rows of first pixel units 110 is disposed on a second side of a corresponding third sub-pixel 113, with the first side opposite to the second side. The second sub-pixel 112 is disposed between the corresponding first sub-pixel 111 and the corresponding third sub-pixel 113.

Exemplarily, the red sub-pixel is the first sub-pixel 111, the green sub-pixel is the second sub-pixel 112, and the blue sub-pixel is the third sub-pixel 113. The first pixel units 110 in the first display region 100 in a row near the top of the display panel is the first row of first pixel units. The arrangement of the sub-pixels in a first pixel unit 110 in the odd rows may be in the manner of RGBG. The red sub-pixel is arranged to the left of the blue sub-pixel, and the centers of the red sub-pixel and the blue sub-pixel are disposed on the same row direction line. The centers of the two green sub-pixels are disposed on the same row direction line and are not co-disposed with the centers of the red sub-pixel and the blue sub-pixel, and the two green sub-pixels are disposed on both sides of a column direction center line of the blue sub-pixel.

The arrangement of the sub-pixels in a first pixel unit 110 in the even rows may be in the manner of BGRG. The red sub-pixel is arranged to the right of the blue sub-pixel, and the centers of the red sub-pixel and the blue sub-pixel are disposed on the same row direction line. The centers of the two green sub-pixels are disposed on the same row direction line and are not co-disposed with the centers of the red sub-pixel and the blue sub-pixel, and the two green sub-pixels are disposed on both sides of the column direction center line of the blue sub-pixel. Among them, in the embodiments, the row direction is illustrated as an H direction and the column direction is illustrated as an L direction as shown in the drawings.

The second display region 200 may be a rectangular structure, and the first display region 100 includes a first sub-display region 11 and a second sub-display region 12, and the first sub-display region 11 and the second sub-display region 12 are respectively disposed on both sides of the second display region 200 along the row direction. Multiple first compensation pixel units 310 are distributed along the column direction between the first sub-display region 11 and the second display region 200, and multiple second compensation pixel units 320 are distributed along the column direction between the second sub-display region 12 and the second display region 200.

The first compensation pixel units 310 and the second compensation pixel units 320 may solve the problem of color shift and color difference at the junction of the second display region 200 and the first display region 100, which may solve a screen effect of the second display region 200 (under-screen camera region), thereby improving the display quality of the display panel.

In some embodiments of the present disclosure, as illustrated in FIG. 2, multiple columns of second pixel units 210 are distributed in the second display region 200. The first sub-pixel 111 in a second pixel unit 210 in a column near the first sub-display region 11 is closer to the first sub-display region than the third sub-pixel 113 in the same second pixel unit 210. The first sub-pixel 111 in a second pixel unit 210 in a column near the second sub-display region 12 is closer to the second sub-display region 12 than the third sub-pixel 113 in the same second pixel unit 210.

By starting a column count in the direction from the first sub-display region 11 to the second sub-display region 12, the distribution of the sub-pixel units of each second pixel unit 210 in the multiple second pixel units 210 from the first column to the penultimate column is consistent.

The first sub-pixel 111 of the same second pixel unit 210 in a column near the first sub-display region 11 is arranged closer to the first sub-display region than the third sub-pixel 113, and the first sub-pixel 111 of the same second pixel unit 210 in a column near the second sub-display region 12 is arranged closer to the second sub-display region 12 than the third sub-pixel 113. The second pixel units 210 of the odd (2i−1) columns and the second pixel units 210 of the even (2i) columns are staggered, and further, the second pixel units 210 of the odd (2i−1) columns and the second pixel units 210 of the even (2i) columns are not aligned in the row direction, which may increase the uniformity of the color of the second display region.

Exemplarily, the sub-pixels of the second pixel unit 210 in the column near the first sub-display region 11 may be arranged in an RGB manner. The red sub-pixel is the first sub-pixel 111, the green sub-pixel is the second sub-pixel 112, and the blue sub-pixel is the third sub-pixel 113. The red sub-pixel is arranged to the left of the blue sub-pixel, and the centers of the red sub-pixel and the blue sub-pixel are disposed on the same row direction line. The green sub-pixel is arranged below a left side of the blue sub-pixel and below a right side of the red sub-pixel. The blue sub-pixel in the second pixel unit 210 in the column near the second sub-display region 12 is arranged on a side of the red sub-pixel unit near the first sub-display region 11, and the green sub-pixel is arranged below a right side of the blue sub-pixel.

On this basis, each first compensation pixel unit 310 includes a third sub-pixel 113, which is arranged in the region between the second display region 200 and the first sub-display region 11. The number of the compensation pixel units 300 in a column may be the same as the number of second pixel units 210 in one column in the second display region 200.

Exemplarily, the red sub-pixel is the first sub-pixel 111, the green sub-pixel is the second sub-pixel 112, and the blue sub-pixel is the third sub-pixel 113. The first compensation pixel unit 310 may include a blue sub-pixel, which may be disposed in the region between the second display region 200 and the first sub-display region 11. The column direction centerline of the blue sub-pixels of the first compensation pixel units 310 may coincide with the column direction centerline of the red sub-pixels in the first column of the second pixel units 210, and each blue sub-pixel of the first compensation pixel units 310 is arranged below a corresponding red sub-pixel in the first column of the second pixel units 210.

Figure 4:
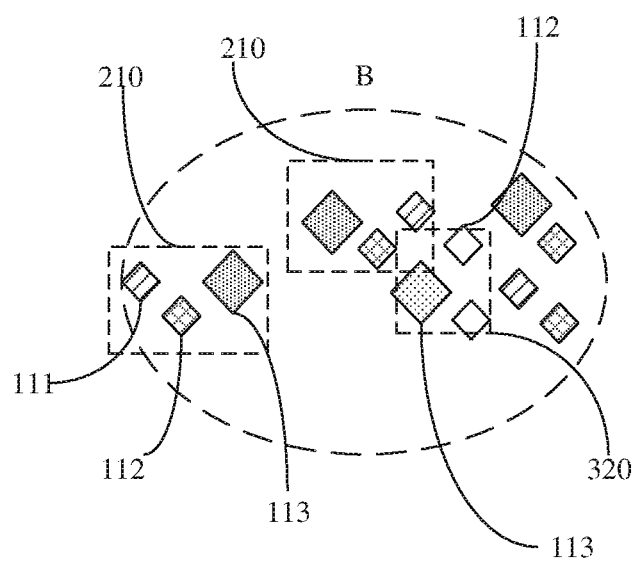
FIG. 4 is a partial enlarged view of area B circumscribed in FIG. 2.

As illustrated in FIG. 4, each second compensation pixel unit 320 includes two second sub-pixels 112 and a third sub-pixel 113. In the same second compensation pixel unit 320, the second sub-pixels 112 are disposed on a side of the third sub-pixel 113 away from the first sub-display region 11, and the second compensation pixel units 320 are disposed in the region where the second display region 200 and the second sub-display region 12 meet.

Exemplarily, the red sub-pixel is the first sub-pixel 111, the green sub-pixel is the second sub-pixel 112, and the blue sub-pixel is the third sub-pixel 113. Each second compensation pixel unit 320 may include a blue sub-pixel and two green sub-pixels. The blue sub-pixel is arranged on a side of the green sub-pixels away from the second sub-display region 12. The column direction centerline of the blue sub-pixels coincides with the column direction centerline of the red sub-pixels in the last column of the second pixel units 210. The number of the second compensation pixel units 320 is the same as the number of the second pixel units 210 in one column, and each blue sub-pixel of the second compensation pixel units 320 is arranged below a corresponding red sub-pixel of the second pixel units 210 in the column. In the second compensation pixel unit 320, one of the two green sub-pixels is disposed to the upper right of the blue sub-pixel, and the row direction center line of the green sub-pixel coincides with the row direction center line of a corresponding green sub-pixel in the last column of second pixel units 210; the other of the two green sub-pixels is disposed to the lower right of the blue sub-pixel, and the row direction center line of the green sub-pixel coincides with the row direction center line of a corresponding green sub-pixel in the penultimate column of second pixel units 210.

The first compensation pixel units 310 and the second compensation pixel units 320 described above enable the sub-pixels on both sides of the second display region 200 to be arranged in a consistent manner, thereby enabling the color shift and color difference in the second display region to be reduced.

Figure 5:
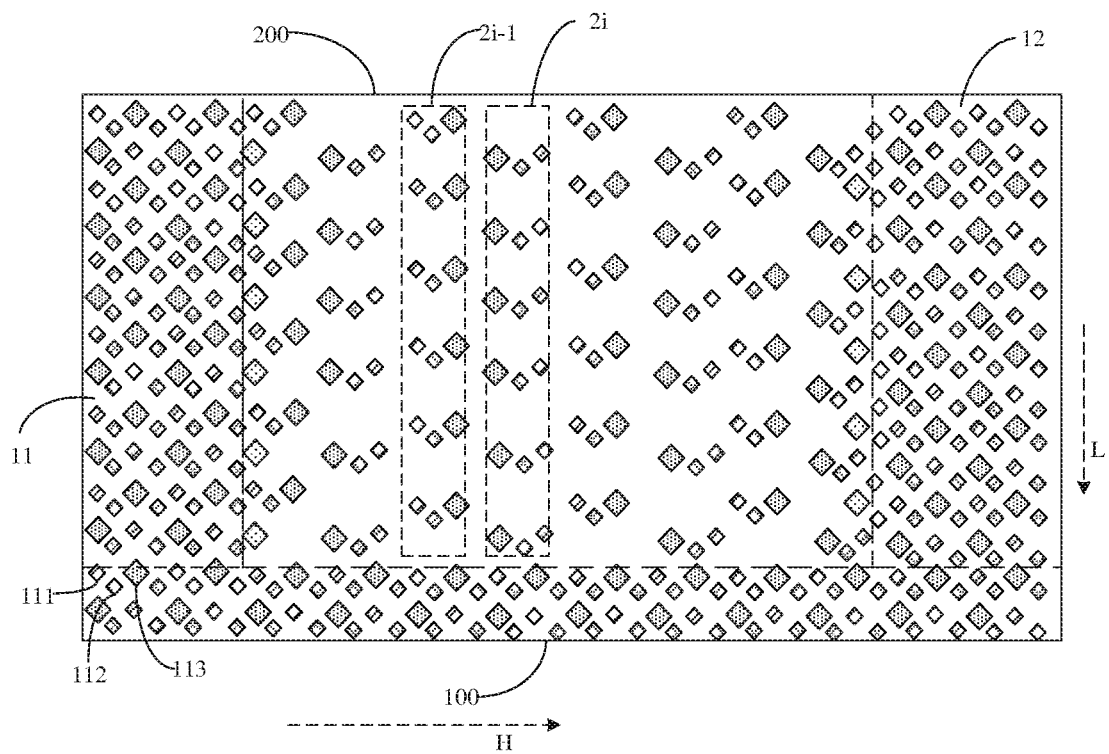
FIG. 5 is a schematic view of pixel distribution of a display panel according to further another embodiment of the present disclosure.

In others embodiment of the present disclosure, as illustrated in FIG. 5, multiple columns of second pixel units 210 are distributed in the second display region 200. The third sub-pixel 113 in a second pixel unit 210 disposed in an odd (2i−1, i being a positive integer) column is disposed on a side of a corresponding first sub-pixel 111 away from the first sub-display region 11, and the third sub-pixel 113 in a second pixel unit 210 disposed in an even (2i, i being a positive integer) column is disposed on a side of a corresponding first sub-pixel 111 near the first sub-display region 11. The second pixel units 210 of the odd columns and the second. pixel units 210 of the even columns are staggered, i.e., the second pixel units 210 of the odd columns and the second pixel units 210 of the even columns are not aligned in the row direction, to increase the color uniformity.

Exemplarily, the arrangement of the sub-pixels of the second pixel unit 210 in an odd column may be arranged in an RGB manner. The red sub-pixel is arranged to the left of the blue sub-pixel, and the centers of the red sub-pixel and the blue sub-pixel are disposed on the same row direction line. The green sub-pixel is arranged below a left side of the blue sub-pixel, and the green sub-pixel is arranged below a right side of the red sub-pixel. The red sub-pixel is the first sub-pixel 111, the green sub-pixel is the second sub-pixel 112, and the blue sub-pixel is the third sub-pixel 113.

On this basis, the first compensation pixel unit 310 includes a third sub-pixel 113, which is arranged in the region between the second display region 200 and the first sub-display region 11. The number of the compensation pixel units 300 in a column may be the same as the number of second pixel units 210 in one column in the second display region 200.

Exemplarily, the red sub-pixel is the first sub-pixel 111, the green sub-pixel is the second sub-pixel 112, and the blue sub-pixel is the third sub-pixel 113. The first compensation pixel unit 310 may include a blue sub-pixel, which may be disposed in the region between the second display region 200 and the first sub-display region 11. The column direction centerline of the blue sub-pixel of the first compensation pixel units 310 may coincide with the column direction centerline of the red sub-pixels in the first column of the second pixel units 210, and each blue sub-pixel of the first compensation pixel units 310 is arranged below a corresponding red sub-pixel in the first column of the second pixel units 210.

The second display region 200 includes second pixel units 210 in an even number of columns, and each second compensation pixel unit 320 includes a second sub-pixel 112 and a third sub-pixel 113. In the second compensation pixel unit 320, the second sub-pixel 112 is disposed on a side of the third sub-pixel 113 away from the first sub-display region 11, and second compensation pixel units 320 are disposed in the region between the second display region 200 and the second sub-display region 12.

Exemplarily, the red sub-pixel is the first sub-pixel 111, the green sub-pixel is the second sub-pixel 112, and the blue sub-pixel is the third sub-pixel 113. Each second compensation pixel unit 320 may include a blue sub-pixel and a green sub-pixel. The blue sub-pixel is arranged on a side of the green sub-pixel away from the second sub-display region 12. The column direction centerline of the blue sub-pixels coincides with the column direction centerline of the red sub-pixels in the last column of the second pixel units 210. The number of the second compensation pixel units 320 is the same as the number of second pixel units 210 in one column, and each blue sub-pixel of the second compensation pixel units 320 is arranged below a corresponding red sub-pixel of the second pixel units 210 in the column. In the second compensation pixel unit 320, the green sub-pixel is disposed to the upper right of the blue sub-pixel and the row direction centerline of the green sub-pixel coincides with the row direction centerline of a corresponding green sub-pixel in the last column of second pixel units 210.

It should be noted that among the multiple columns of second pixel units 210 in the second display region 200 in the embodiments, a starting column of numbering is the column of second pixel units 210 adjacent to the first sub-display region 11. That is, the first column of second pixel units 210 is adjacent to the first sub-display region 11, and the last column of second pixel units 210 is adjacent to the second sub-display region 12.

When the display panel is applied to an electronic device with an under-screen camera, the second display region 200 is arranged with multiple light-transmitting units for transmitting external light to the under-screen camera for imaging. The multiple light-transmitting units may be staggered with the second pixel units 210 in the second display region 200.

The first display region 100 may surround the second display region 200, for example, the second display region 200 may be inside the first display region 100. Alternatively, the second display region 200 may be arranged at an edge of the first display region 100, for example, the second display region 200 may be arranged at the top of the first display region 100. In this case, the first display region 100 partially surrounds the second display region 200.

In some embodiments, the pixel arrangement may be a diamond arrangement. The first sub-pixel 111 may be a diamond-shaped sub-pixel, the second sub-pixel 112 may be a diamond-shaped sub-pixel, and the third sub-pixel 113 may be a diamond-shaped sub-pixel. The area of the third sub-pixel 113 may be greater than the area of the first sub-pixel 111, and the area of the third sub-pixel 113 may be greater than the area of the second sub-pixel 112. The area of the first sub-pixel 111 may be the same as the area of the second sub-pixel 112. Of course, in practical applications, the first sub-pixel 111, the second sub-pixel 112, and the third sub-pixel 113 may be in other shapes, such as rectangular, triangular, or oval, etc., without limitation herein.

The pixel density of the first display region is greater than the pixel density of the second display region, for example, the pixel density of the second display region may be one-half of the pixel density of the first display region. Of course, the ratio of the pixel density of the second display region to the pixel density of the first display region may be other values in practical applications, and embodiments of the present disclosure are not limited in this regard.

Figure 6:
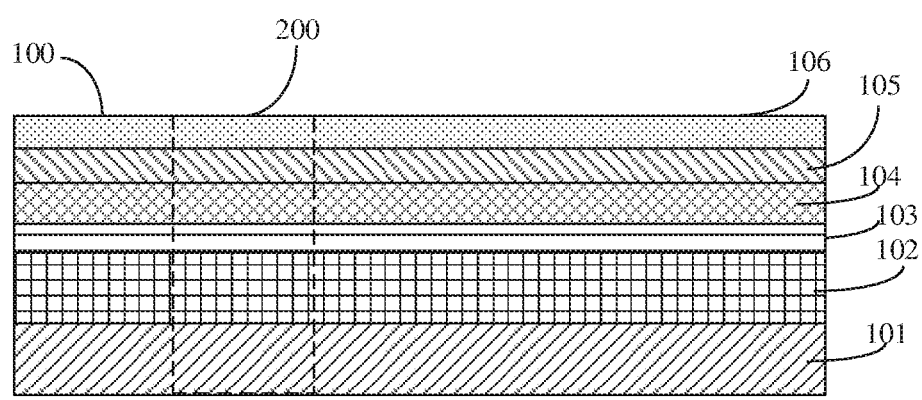
FIG. 6 is a schematic view of a display panel according to an embodiment of the present disclosure.

A display panel provided by embodiments of the present disclosure may be an OLED display panel. As illustrated in FIG. 6, the display panel may include a substrate 101, a driver circuit layer 102, a pixel electrode layer 103, a light-emitting layer 104, a common electrode layer 105, a pixel definition layer (not shown), and a cover 106, etc. The driver circuit layer 102 is arranged on the substrate 101, the pixel electrode layer 103 is arranged on a side of the driver circuit layer 102 away from the substrate 101, and the light-emitting layer 104 is arranged on a side of the pixel electrode layer 103 away from the driver circuit layer 102. The pixel definition layer surrounds a light-emitting unit in the light-emitting layer 104, and the pixel definition layer defines an opening from which the light-emitting unit is exposed. The common electrode layer 105 covers the light-emitting unit and the pixel definition layer, and the cover 106 is arranged on a side of the common electrode layer 105 away from the driver circuit layer 102.

The light-emitting layer 104 may include a first light-emitting region and a second light-emitting region, the first light-emitting region overlapped with the first pixel region, and the second light-emitting region overlapped with the second pixel region. The first light-emitting region may include multiple first light-emitting units, and the second light-emitting region may include multiple second light-emitting units. The first light-emitting units are arranged facing the first pixel units 110 in the above embodiments, and the first light-emitting units in the first light-emitting region are distributed in the same manner as the first pixel units 110 in the first display region 100. The second light-emitting units are arranged facing the second pixel units 210 in the above embodiments, and the second light-emitting units in the second light-emitting region are distributed in the same manner as the second pixel units 210 in the second display region 200. Two sides of the second light-emitting region adjacent to the first light-emitting region may be arranged with first compensation light-emitting units and second compensation light-emitting units, respectively.

Each first light-emitting unit may include multiple sub-light-emitting units, each sub-light-emitting unit is arranged facing a corresponding sub-pixel in the above embodiments. The red sub-pixel corresponds to a red sub-light-emitting unit, the green sub-pixel corresponds to a green sub-light-emitting unit, and the blue sub-pixel corresponds to a blue sub-light-emitting unit. The shape and arrangement of the sub-light-emitting units are consistent with the corresponding sub-pixels. For example, the arrangement of sub-light-emitting units in the first light-emitting unit may be in the manner of RGBG or BGRG.

Each second light-emitting unit may include multiple sub-light-emitting units, and each sub-light-emitting unit is arranged facing a corresponding sub-pixel in the above embodiments. The red sub-pixel corresponds to a red sub-light-emitting unit, the green sub-pixel corresponds to a green sub-light-emitting unit, and the blue sub-pixel corresponds to a blue sub-light-emitting unit. The shape and arrangement of the sub-light-emitting units are consistent with the corresponding sub-pixels. For example, the arrangement of sub-light-emitting units in the second light-emitting unit may be in the manner of RGB or BGR. Each first compensation light-emitting unit may include a blue sub-light-emitting unit, and each second compensation light-emitting unit may include a blue sub-light-emitting unit and a green sub-light-emitting unit.

The pixel electrode layer 103 includes a first electrode region and a second electrode region, the first electrode region overlapped with the first pixel region, and the second electrode region overlapped with the second pixel region. The first electrode region may include multiple first electrode units, and the second electrode region may include multiple second electrode units. The first electrode units are arranged facing the first pixel units 110 in the above embodiment, and the first electrode units in the first electrode region are distributed in the same manner as the first pixel units 110 in the first display region 100. The second electrode units are arranged facing the second pixel units 210 in the above embodiments, and the second electrode units in the second electrode region are distributed in the same manner as the second pixel units 210 in the second display region 200. Two sides of the second electrode region adjacent to the first electrode region may be arranged with first compensation electrode units and second compensation electrode units, respectively.

Each first electrode unit may include multiple sub-electrode units, each sub-electrode unit is arranged facing a corresponding sub-pixel in the above embodiments. The red sub-pixel corresponds to a red sub-electrode unit, the green sub-pixel corresponds to a green sub-electrode unit, and the blue sub-pixel corresponds to a blue sub-electrode unit. The shape and arrangement of the sub-electrode units are consistent with the corresponding sub-pixels. For example, the arrangement of the sub-electrode units in the first electrode unit may be in the manner of RGBG or BGRG.

Each second electrode unit may include multiple sub-electrode units, and each sub-electrode unit is arranged facing a corresponding sub-pixel in the above embodiments. The red sub-pixel corresponds to a red sub-electrode unit, the green sub-pixel corresponds to a green sub-electrode unit, and the blue sub-pixel corresponds to a blue sub-electrode unit. The shape and arrangement of the sub-electrode units are consistent with the corresponding sub-pixels. For example, the arrangement of the sub-electrode units in the second electrode unit may be in the manner of RGB or BGR.

The pixel definition layer includes a first opening region and a second opening region, the first opening region overlapped with the first pixel region, and the second opening region overlapped with the second pixel region. Multiple openings are defined on the first opening region, and each opening is disposed facing a corresponding sub-pixel for exposing a corresponding light-emitting unit. The second opening region defines a pixel opening and a light-transmitting opening, the pixel opening facing a corresponding sub-pixel in the second display region 200, and the light-transmitting opening facing a corresponding light-transmitting unit in the second display region 200. The pixel openings and the light-transmitting openings are staggered.

A pixel driving circuit is arranged in the driver circuit layer 102, and the pixel driving circuit includes multiple driving units. Each sub-pixel is connected to a corresponding driving unit, which is configured to provide a drive signal to the sub-pixel The driving unit may be arranged under the sub-pixel, where the light-transmitting unit may not be arranged without a driving unit in a projection region of the driver circuit layer to increase the light transmission of the light-transmitting unit.

Figure 7:
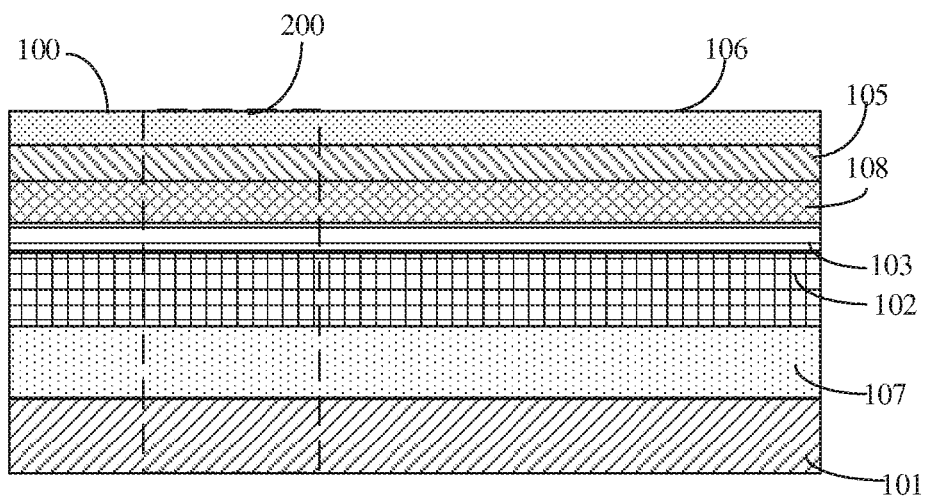
FIG. 7 is a schematic view of a display panel according to another embodiment of the present disclosure.

It is understood that, the display panel may be a liquid crystal display panel. As illustrated in FIG. 7, the display panel may include a substrate 101, a backlight module 107, a driver circuit layer 102, a pixel electrode layer 103, a liquid crystal layer 108, a common electrode layer 105, a color film layer 120, a black matrix layer 130, and a cover 106, etc. The backlight module 107 may be arranged on the substrate 101, the driver circuit layer 102 is arranged on a side of the backlight module 107 away from the substrate 101, the pixel electrode layer 103 is arranged on a side of the driver circuit layer 102 away from the backlight module 107, the liquid crystal layer 108 is arranged on a side of the pixel electrode layer 103 away from the driver circuit layer 102, the common electrode layer 105 is arranged on a side of the liquid crystal layer 108 away from the pixel electrode layer 103, and the color film layer 120 is arranged on a side of the common electrode layer 105 away from the liquid crystal layer 108. The color film layer 120 includes a color pattern, the black matrix layer 130 surrounds the color pattern, and the cover 106 is arranged on a side of the color film layer 120 away from the common electrode layer 105.

The pixel electrode layer 103 includes a first electrode region and a second electrode region, the first electrode region overlapped with the first pixel region, and the second electrode region overlapped with the second pixel region. The first electrode region may include multiple first electrode units, and the second electrode region may include multiple second electrode units. The first electrode units are arranged facing the first pixel units 110 in the embodiments, and the first electrode units in the first electrode region are distributed in the same manner as the first pixel units 110 in the first display region 100. The second electrode units are arranged facing the second pixel units 210 in the above embodiments, and the second electrode units in the second electrode region are distributed in the same manner as the second pixel units 210 in the second display region 200. Two sides of the second electrode region adjacent to the first electrode region may be arranged with first compensation electrode units and second compensation electrode units, respectively.

Each first electrode unit may include multiple sub-electrode units, each sub-electrode unit is arranged facing a corresponding sub-pixel in the above embodiments. The red sub-pixel corresponds to a red sub-electrode unit, the green sub-pixel corresponds to a green sub-electrode unit, and the blue sub-pixel corresponds to a blue sub-electrode unit. The shape and arrangement of the sub-electrode units are consistent with the corresponding sub-pixels. For example, the arrangement of the sub-electrode units in the first electrode unit may be in the manner of RGBG or BGRG.

Each second electrode unit may include multiple sub-electrode units, and each sub-electrode unit is arranged facing a corresponding sub-pixel in the above embodiments. The red sub-pixel corresponds to a red sub-electrode unit, the green sub-pixel corresponds to a green sub-electrode unit, and the blue sub-pixel corresponds to a blue sub-electrode unit. The shape and arrangement of the sub-electrode units are consistent with the corresponding sub-pixels. For example, the arrangement of the sub-electrode units in the second electrode unit may be in the manner of RGB or BGR.

Figure 9:
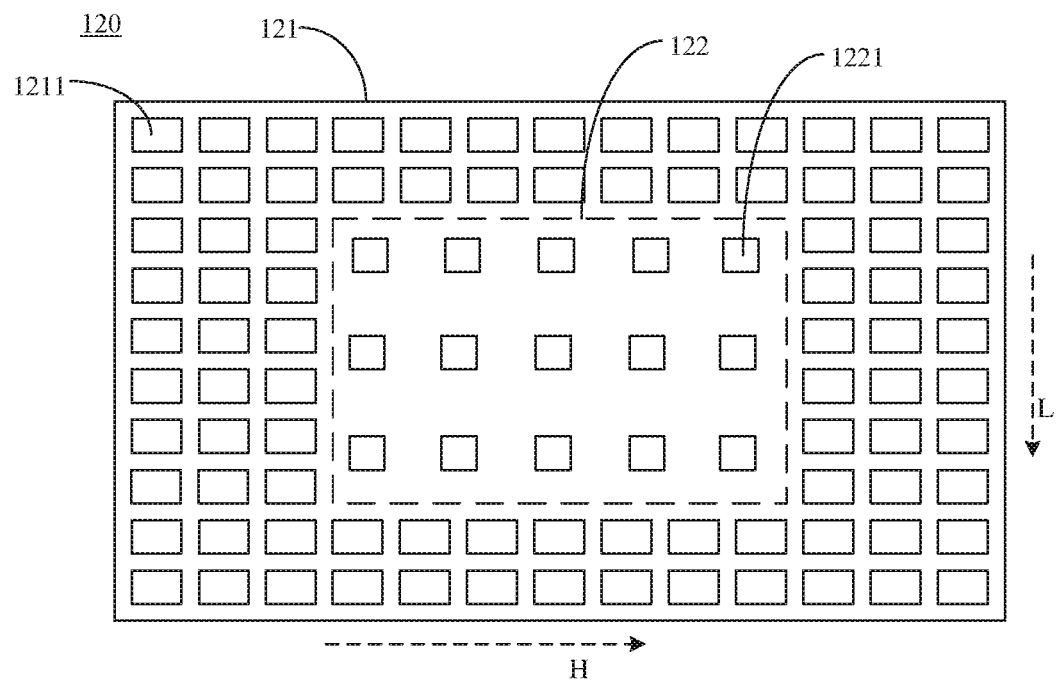
FIG. 9 is a structural schematic view of a color film layer according to an embodiment of the present disclosure.

FIG. 9 illustrates a structural schematic view of a color film layer according to an embodiment of the present disclosure. The color film layer 120 is arranged with a color pattern, and the color film layer may include a first pattern region 121 and a second pattern region 122. Multiple first pattern blocks 1211 in multiple colors are arranged in the first pattern region 121, and the first pattern blocks 1211 are arranged facing the first pixel units 110. The arrangement of patterns of the first pattern blocks may be in the manner of RGBG or BGRG, etc. Multiple second pattern blocks 1221 in multiple colors are arranged in the second pattern region 122, and the second pattern blocks 1221 are arranged facing the second pixel units 210. The arrangement of patterns of the second pattern blocks may be in the manner of RGB or BGR, etc. Two sides of the second pattern region adjacent to the first pattern region may be arranged with first compensation patterns and second compensation patterns, respectively.

Figure 10:
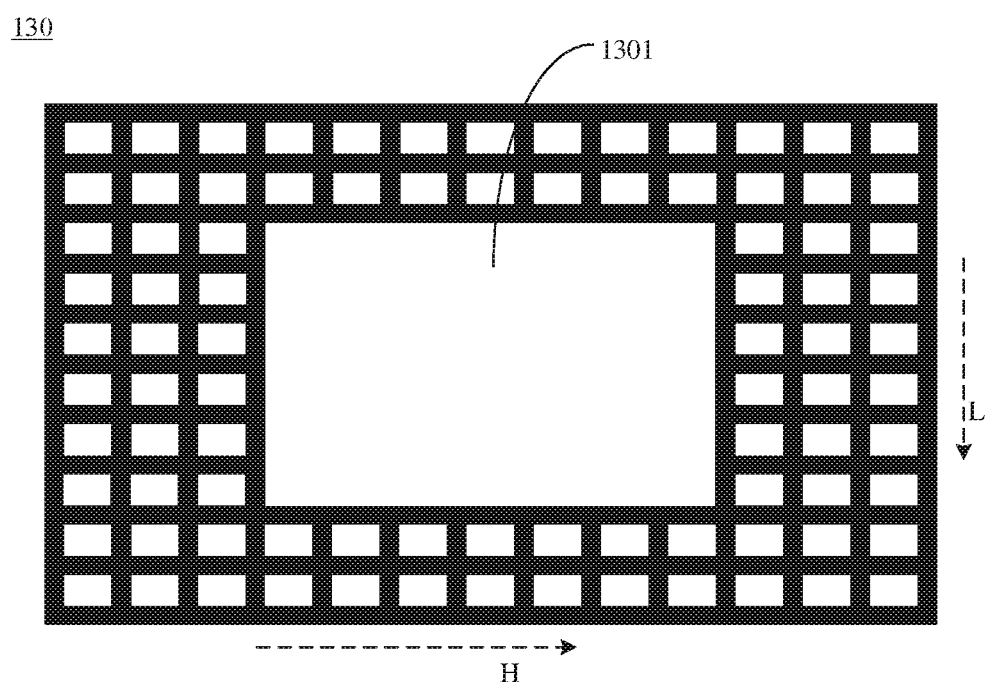
FIG. 10 is a structural schematic view of a black matrix layer according to an embodiment of the present disclosure.

The color pattern on the color film layer 120 is exposed to the black matrix layer 130, i.e., the black matrix layer 130 defines an opening in the region of the color pattern layer. FIG. 10 illustrates a structural schematic view of a black matrix layer according to an embodiment of the present disclosure. The black matrix layer 130 is arranged with a light transmission region 1301 in the region facing the second display region 200, is configured to transmit external light to the under-screen camera. The second display region 200 may define a through hole in the projection region of the backlight module to facilitate the passage of light through the backlight module.

Embodiments of the present disclosure provide a display panel including a first display region 100 and a second display region 200, the first display region 100 including multiple first pixel units 110, the first pixel units 110 including multiple sub-pixels, and the second display region 200 including multiple second pixel units 210; the pixel density of the first display region is greater than the pixel density of the second display region, and the number of sub-pixels in the second pixel unit 210 is less than the number of sub-pixels in the first pixel unit 110. The blank region may be formed in the second display region 200, and the blank region may be configured to arrange light-transmitting units to realize the light intake of an under-screen camera module, taking into account both the light intake of the under-screen camera module and the display of the second display region 200, which is conducive to realizing the full-screen display of the display panel in a real sense. In addition, by arranging the compensation pixel units 300 at the junction of the first display region 100 and the second display region 200, the problem of color difference between the first is ay region 100 and the second display region 200 may be solved.

The first compensation pixel unit 310 and the second compensation pixel unit 320 can solve the problem of color shift and color difference at the junction of the second display region 200 and the first display region 100 and the first compensation pixel unit 310 and the second compensation pixel unit 320 may enable the sub-pixel arrangement on both sides of the second display region 200 to be consistent, which may solve a screen effect of the second display region 200 (under-screen camera region), thereby improving the display quality of the display panel.

Figure 8:
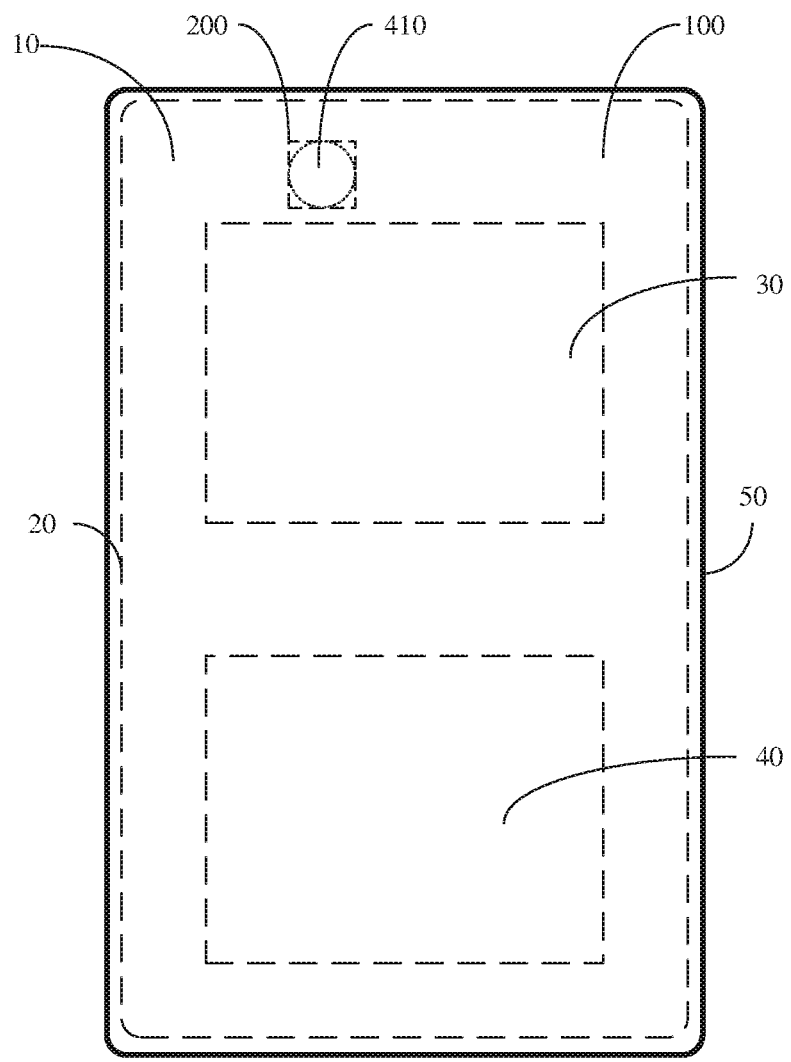
FIG. 8 is a schematic view of an electronic device according to an embodiment of the present disclosure.

Embodiments of the present disclosure further provide an electronic device. As illustrated in FIG. 8, the electronic device includes the display panel 10 described above.

Further, the electronic device further includes a camera module arranged at a hack of the display panel, and the camera module faces the second display region.

The electronic device may include, for example, a mobile phone, a tablet computer, a television, a laptop computer, a digital photo frame, a navigator, and any other product or component having a display function.

As illustrated in FIG. 8, the electronic device provided by the embodiments of the present disclosure further includes a bezel 20, a main board 30, a battery 40, and a back cover 50. The display panel 10 is arranged on the bezel 20 to form a display surface of the electronic device, and the display panel 10 serves as a front housing of the electronic device. The back cover 50 is attached to the bezel by double-sided adhesive, and the display panel 10, the bezel 20 and the back cover 50 define a holding space for accommodating other electronic components or functional modules of the electronic device. In addition, the display panel 10 forms the display surface of the electronic device for displaying images, text, and other information. The display panel 10 may be a liquid crystal display or organic light-emitting diode display and other types of displays.

The display panel 10 may be arranged with a glass cover. The glass cover may cover the display panel 10 to protect the display panel 10 from being scratched or damaged by water.

The display panel 10 may be a full-screen display panel. In this case, the display panel 10 can display information in full screen, such that the electronic device has a large screen-to-body ratio. The display panel 10 may have a first display region 100 and a second display region 200. An under-screen camera requires the display screen to be translucent when in use. Therefore, arranging a light-transmitting region in the second display region of low pixel density can increase the light transmission rate. The camera module 410 may be a front camera. Functional modules such as a proximity sensor may be hidden under the display panel 10, while a fingerprint recognition module of the electronic device may be arranged on the back of the electronic device.

The bezel 20 may be a hollow frame structure. The material of the bezel 20 may include metal or plastic. The main board 30 is arranged inside the holding space. For example, the main board 30 may be arranged on the bezel 20 and accommodated in the holding space along with the bezel 20. The main board 30 is arranged with a grounding point to achieve grounding of the main board 30. The main board 30 may have one or more of a motor, a microphone, a speaker, a receiver, a headphone interface, a universal serial bus interface (USB interface), a camera, a proximity sensor, an ambient light sensor, a gyroscope, and a processor and other functional modules integrated on the main board 30. In addition, the display panel 10 may be electrically connected to the main board 30.

The main board 30 is arranged with a display control circuit. The display control circuit outputs electrical signals to the display panel 10 to control the display panel 10 to display information.

The battery 40 is arranged inside the holding space. For example, the battery 40 may be arranged on the bezel 20 and accommodated in the holding space along with the bezel 20. The battery 40 may be electrically connected to the main board 30 to enable the battery 40 to power the electronic device. The main board 30 may be arranged with a power management circuit. The power management circuit is configured to distribute voltage provided by the battery 40 to various electronic components in the electronic device.

The back cover 50 is configured to form an external contour of the electronic device. The back cover 50 may be molded in one piece. During the molding of the back cover 50, structures such as a rear camera hole, a fingerprint recognition module mounting hole, etc. may be defined on the back cover 50.

Other embodiments of the present disclosure will readily come to the mind of those skilled in the art after considering the specification and practicing the solution disclosed herein. The present disclosure is intended to cover any variations, uses, or adaptations of the present disclosure that follow the general principles of the present disclosure and include commonly known or customary technical means in the art that are not disclosed herein. The specification and embodiments are to be considered exemplary only, and the true scope and spirit of the present disclosure is indicated by the appended claim.

What is claimed is:

1. A display panel, comprising:
   a first display region, comprising a plurality of first pixel units; and
   a second display region, comprising a plurality of second pixel units and a plurality of compensation pixel units; wherein a pixel density of the first display region is greater than a pixel density of the second display region; the first display region and the second display region are connected, and the plurality of compensation pixel units are arranged in a region between the second display region and the first display region; the plurality of compensation pixel units are configured to compensate for a color difference between the first display region and the second display region;
   wherein the plurality of compensation pixel units comprise a plurality of first compensation pixel units and a plurality of second compensation pixel units; the plurality of first compensation pixel units are disposed on a side of the second display region, and the plurality of second compensation pixel units are disposed on another side of the second display region opposite to the side along a row direction;
   the first display region comprises a first sub-display region and a second sub-display region; the first sub-display region is disposed on a first side of the second display region, and the second sub-display region is disposed on a second side of the second display region opposite to the first side along the row direction;
   each first compensation pixel unit comprises only one third sub-pixel, which is arranged in a region between the second display region and the first sub-display region; and
   each second compensation pixel unit comprises only two second sub-pixels and one third sub-pixel; in each second compensation pixel unit, the two second sub-pixels are disposed on a side of the third sub-pixel away from the first sub-display region; and the second compensation pixel units are disposed in a region between the second display region and the second sub-display region.

2. The display panel according to claim 1, wherein a number of sub-pixels in each second pixel units is less than a number of sub-pixels in each first pixel unit.

3. The display panel according to claim 2, wherein the sub-pixels of the first pixel unit comprise a first sub-pixel, two second sub-pixels, and a third sub-pixel; and
   the sub-pixels of the second pixel unit comprise a first sub-pixel, a second sub-pixel, and a third sub-pixel;
   wherein an area of the third sub-pixel is greater than an area of the first sub-pixel and greater than an area of the second sub-pixel.

4. The display panel according to claim 3, wherein the plurality of first pixel units of the first display region are distributed in a plurality of rows; in each first pixel unit in an odd row, the first sub-pixel is disposed on a first side of the third sub-pixel; in each first pixel unit in an even row, the first sub-pixel is disposed on a second side of the third sub-pixel, the first side being opposite to the second side.

5. The display panel according to claim 3, wherein the plurality of first compensation pixel units are distributed along a column direction between the first sub-display region and the second display region, and the plurality of second compensation pixel units are distributed along the column direction between the second sub-display region and the second display region.

6. The display panel according to claim 5, wherein the plurality of second pixel units of the second display region are distributed in a plurality of rows; in each second pixel unit in an odd row, the third sub-pixel is disposed on a side of the first sub-pixel away from the first sub-display region; in each second pixel unit in an even row, the third sub-pixel is disposed on a side of the first sub-pixel close to the first sub-display region.

7. The display panel according to claim 5, wherein in each second pixel unit in a column close to the first sub-display region, the first sub-pixel is closer to the first sub-display region than the third sub-pixel; in each second pixel unit in a column close to the second sub-display region, the first sub-pixel is closer to the second sub-display region than the third sub-pixel.

8. The display panel according to claim 3, wherein the first sub-pixel is a red sub-pixel, the second sub-pixel is a green sub-pixel, and the third sub-pixel is a blue sub-pixel.

9. The display panel according to claim 3, wherein the first sub-pixel is a red sub-pixel, the second sub-pixel is a yellow sub-pixel, and the third sub-pixel is a blue sub-pixel.

10. The display panel according to claim 1, further comprising:
a light-emitting layer, comprising a first light-emitting region and a second light-emitting region, the first light-emitting region being overlapped with the first display region, and the second light-emitting region being overlapped with the second display region; wherein the first light-emitting region comprises a plurality of first light-emitting units, and the second light-emitting region comprises a plurality of second light-emitting units; the plurality of first light-emitting units are arranged facing the plurality of first pixel units, and the plurality of second light-emitting units are arranged facing the plurality of second pixel units.

11. The display panel according to claim 10, further comprising:
a pixel electrode layer, comprising a first electrode region and a second electrode region, the first electrode region being overlapped with the first display region, and the second electrode region being overlapped with the second display region; wherein the first electrode region comprises a plurality of first electrode units, and the second electrode region comprises a plurality of second electrode units; the plurality of first electrode units are arranged facing the plurality of first pixel units, and the plurality of second electrode units are arranged facing the plurality of second pixel units.

12. The display panel according to claim 10, further comprising:
a driver circuit layer, wherein a pixel driving circuit is arranged in the driver circuit layer, and the pixel driving circuit comprises a plurality of driving units; each sub-pixel is connected to a corresponding driving unit.

13. The display panel according to claim 1, further comprising:
a color film layer, comprising a first pattern region and a second pattern region; wherein a plurality of first pattern blocks in a plurality of colors are arranged in the first pattern region, and the plurality of first pattern blocks are arranged facing the plurality of first pixel units; a plurality of second pattern blocks in a plurality of colors are arranged in the second pattern region, and the plurality of second pattern block are arranged facing the plurality of second pixel units.

14. The display panel according to claim 13, further comprising:
a black matrix layer, defining a plurality of openings configured to expose the plurality of first pattern blocks and the plurality of second pattern blocks.

15. The display panel according to claim 14, wherein the black matrix layer is arranged with a light transmission region facing the second display region, configured to transmit external light to an under-screen camera.

16. An electronic device, comprising a display apparatus; wherein the display apparatus comprises:
a display panel, comprising:
a first display region, comprising a plurality of first pixel units; and
a second display region, comprising a plurality of second pixel units and a plurality of compensation pixel units; wherein a pixel density of the first display region is greater than a pixel density of the second display region; the first display region and the second display region are connected, and the plurality of compensation pixel units are arranged in a region between the second display region and the first display region; the plurality of compensation pixel units are configured to compensate for a color difference between the first display region and the second display region;
wherein the plurality of compensation pixel units comprise a plurality of first compensation pixel units and a plurality of second compensation pixel units; the plurality of first compensation pixel units are disposed on a side of the second display region, and the plurality of second compensation pixel units are disposed on another side of the second display region opposite to the side along a row direction;
the first display region comprises a first sub-display region and a second sub-display region; the first sub-display region is disposed on a first side of the second display region, and the second sub-display region is disposed on a second side of the second display region opposite to the first side along the row direction;
each first compensation pixel unit comprises only one third sub-pixel, which is arranged in a region between the second display region and the first sub-display region; and
each second compensation pixel unit comprises only two second sub-pixels and one third sub-pixel; in each second compensation pixel unit, the two second sub-pixels are disposed on a side of the third sub-pixel away from the first sub-display region; and
the second compensation pixel units are disposed in a region between the second display region and the second sub-display region;
a transparent cover, arranged on a light-emitting side of the display panel; and
a camera module, arranged on a back side of the display panel; wherein the camera module is arranged facing the second display region.

17. A display panel, comprising:
a first display region, comprising a plurality of first pixel units; and
a second display region, comprising a plurality of second pixel units, a plurality of first compensation pixel units, and a plurality of second compensation pixel units;

wherein a pixel density of the first display region is greater than a pixel density of the second display region;

wherein the second display region is a rectangular structure; the first display region comprises a first sub-display region and a second sub-display region, the first sub-display region being disposed on a first side of the second display region, the second sub-display region being disposed on a second side of the second display region, and the first side and the second side being opposite to each other along a row direction;

wherein the plurality of first compensation pixel units are distributed along a column direction between the first sub-display region and the second display region, and the plurality of second compensation pixel units are distributed along the column direction between the second sub-display region and the second display region, the column direction being perpendicular to the row direction;

each first compensation pixel unit comprises only one third sub-pixel, which is arranged in a region between the second display region and the first sub-display region; and each second compensation pixel unit comprises only two second sub-pixels and one third sub-pixel; in each second compensation pixel unit, the two second sub-pixels are disposed on a side of the third sub-pixel away from the first sub-display region; and the second compensation pixel units are disposed in a region between the second display region and the second sub-display region.

18. The display panel according to claim 17, wherein a number of sub-pixels in each second pixel units is less than a number of sub-pixels in each first pixel unit; the sub-pixels of the first pixel unit comprise a first sub-pixel, two second sub-pixels, and a third sub-pixel, and the sub-pixels of the second pixel unit comprise a first sub-pixel, a second sub-pixel, and a third sub-pixel.

* * * * *